(12) United States Patent
Booth et al.

(10) Patent No.: US 8,289,807 B2
(45) Date of Patent: *Oct. 16, 2012

(54) SELECTIVE EDGE PHASE MIXING

(75) Inventors: Eric R. Booth, Boise, ID (US); Tyler J. Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/184,252

(22) Filed: Jul. 15, 2011

(65) Prior Publication Data

US 2011/0273212 A1 Nov. 10, 2011

Related U.S. Application Data

(63) Continuation of application No. 12/605,806, filed on Oct. 26, 2009, now Pat. No. 7,990,802, which is a continuation of application No. 11/938,516, filed on Nov. 12, 2007, now Pat. No. 7,609,583.

(51) Int. Cl.
 *G11C 8/00* (2006.01)
(52) U.S. Cl. ........... 365/233.1; 365/189.08; 365/233.12; 327/175
(58) Field of Classification Search .............. 365/233.12
 See application file for complete search history.

(56) References Cited

U.S. PATENT DOCUMENTS

| | | | |
|---|---|---|---|
| 5,182,467 A | 1/1993 | Taylor et al. | |
| 5,777,500 A | 7/1998 | Eitrheim | |
| 5,930,689 A | 7/1999 | Wilhite et al. | |
| 6,269,451 B1 | 7/2001 | Mullarkey | |
| 6,621,313 B2 | 9/2003 | Kurd et al. | |
| 7,202,722 B2 | 4/2007 | Mahadevan et al. | |
| 7,239,560 B2 | 7/2007 | Lee et al. | |
| 7,307,461 B2 | 12/2007 | Nguyen et al. | |
| 7,598,783 B2 * | 10/2009 | Shin et al. ...................... | 327/158 |
| 7,609,583 B2 | 10/2009 | Booth et al. | |
| 7,764,554 B2 * | 7/2010 | Kwon ....................... | 365/189.15 |
| 7,990,802 B2 * | 8/2011 | Booth et al. ............... | 365/233.1 |
| 2008/0056030 A1 | 3/2008 | Cho | |
| 2009/0122635 A1 | 5/2009 | Booth et al. | |
| 2010/0045353 A1 | 2/2010 | Booth et al. | |

\* cited by examiner

*Primary Examiner* — Tan T. Nguyen
(74) *Attorney, Agent, or Firm* — Schwegman, Lundberg & Woessner, P.A.

(57) ABSTRACT

Electronic apparatus, systems, and methods to implement selective edge phase mixing are disclosed. A selective edge phase mixing system includes a processor and memory device configured to perform operations in synchronization with transitions of an externally provided clock signal. A selective edge phase mixing unit for the memory device may include a first logic gate that receives the clock signal at an input port and receives first control signals, and pull-up circuits in communication with an output of the first logic gate and first control signals. A second logic gate receives the clock signal at the input port and receives second control signals. Pull-down circuits are coupled to the second logic gate and the second control signals, wherein the pull-up circuits and the pull-down circuits are coupled to the output port to provide a duty cycle corrected clock signal to the memory device. Additional apparatus, systems, and methods are disclosed.

20 Claims, 7 Drawing Sheets

SELECTIVE EDGE PHASE MIXING

RELATED APPLICATION

This application is a continuation of U.S. application Ser. No. 12/605,806, filed Oct. 26, 2009 now U.S. Pat. No. 7,990,802, which is a continuation of U.S. application Ser. No. 11/938,516 filed Nov. 12, 2007, now issued as U.S. Pat. No. 7,609,583, which applications are incorporated herein by reference in their entirety.

BACKGROUND

Various systems, such as general-purpose computational devices, digital signal processors, video devices, and the like, include a high-speed memory system operable to store encoded instructions and data, and an attached processor that is configured to interpret and process the instructions. In general, the encoded instructions control the various processing operations of the processor, which can in turn access the data. Since processing speeds can be much greater than memory access speeds, various operational difficulties may be encountered in exchanging information between the processor and the memory.

BRIEF DESCRIPTION OF THE DRAWINGS

Various embodiments are described in detail in the discussion below, with reference to the following drawings.

DETAILED DESCRIPTION

Figure 1:
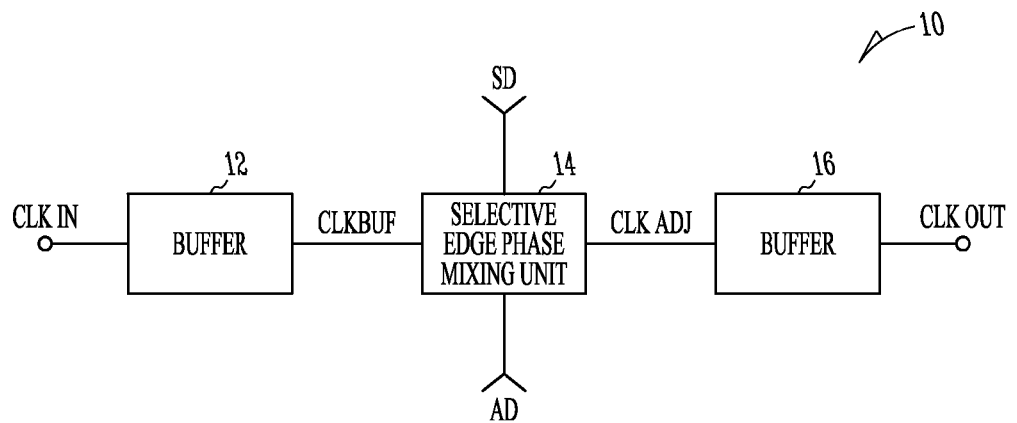
FIG. 1 is a diagrammatic block view of a selective edge phase mixing apparatus according to various embodiments.

One technique for dealing with increasing operating speeds of systems is to employ synchronous integrated memory devices in the various digital systems. In general, synchronous integrated devices are synchronized by an applied clock signal, so that various operations may be performed at selected times. For example, the various operations may be synchronized with the rising and/or falling edges of the applied clock signal. Examples of such synchronous integrated memory devices may include synchronous dynamic random access memory (SDRAM) devices, synchronous static random access memory (SSRAM) devices, and may further include memory devices such as a synchronous link dynamic access memory (SLDRAM) devices, a RAMBUS dynamic random access memory (RDRAM), as well as other memory devices.

In particular, and with reference now to SDRAM, input and output latches are provided in the SDRAM to retain information that is to be transferred to, or from the controlling processor. For example, because input information, such as one or more memory address locations, one or more control signals, or data is latched, the processor may perform various other processing tasks while the SDRAM completes its task. In order to properly synchronize the SDRAM, an internal clock signal is developed in response to an external clock signal provided by the processor. The internal clock signal may therefore be made available to the latches at the appropriate times so that the data may be successfully transferred.

One significant problem the inventors have encountered in synchronous memory devices is that a time delay is introduced by circuitry within the memory device that causes the internal clock signal to be phase-shifted relative to the external clock signal. In cases where differences between the internal clock signal and the external clock signal are relatively insignificant, compensation for the differences (e.g., the phase shift) may be easily performed. As the frequency of the external clock is increased, however, differences between the external clock signal and the internal clock signal may become important, since even small differences between the external clock signals and the internal clock signals may prevent the proper application of commands sent to the memory by the processor.

One technique for addressing the foregoing problem includes the use of a digital delay-locked loop (DLL) to generate the internal clock signal. Typically, a time delay is applied to the external clock signal, and the DLL tracks the external and internal clock signals and adjusts the time delay in order to keep the internal and external clock signals suitably synchronized. Although the DLL is operable to provide some degree of synchronization, the inventors have discovered that various problems nevertheless exist. For example, a principal component of the DLL is a delay chain that includes a plurality of serially coupled delay gates, which, together with other associated circuits, disadvantageously occupies a relatively large layout area. Further, in order to achieve the desired synchronization, a large number of gates may be required, which disadvantageously introduces "jitter" into the clock signals. Excessive amounts of heat may also be generated.

Another significant problem that the inventors have encountered as external clock signals increase involves undesired duty cycle variations. Briefly, and in general terms, an optimum duty cycle for a clock signal is approximately 50 percent, so that the clock signal is at a "high" state for approximately the same time that the clock signal is at a "low" state. Again, in cases where differences between the internal clock signal and the external clock signal are relatively insignificant, variations in duty cycle may, in turn, be relatively insignificant. As the frequency of the external clock is increased, however, duty cycle variations may become significant. In extreme cases, if such duty cycle variations are left uncorrected, the memory device fails to operate properly.

In response to the foregoing, the inventors have discovered that some phase-mixing techniques may be used for duty cycle adjustment. In one technique, a signal is split into zero degree and 180 degree phases, the delay of an appropriate phase may then be adjusted, and then the split phases may be combined. Although this technique may provide the desired adjustment, the inventors have discovered that various problems nevertheless can exist. For example, in certain cases, the phase-mixing fails to provide a sufficiently-wide range of adjustment.

Therefore, the inventors have discovered that apparatus, systems, and methods are needed to compensate for duty cycle distortion in synchronous integrated circuits while avoiding the shortcomings associated with the techniques described. As described herein, various embodiments of the invention include apparatus and systems that operate to compensate for duty cycle distortion in synchronous integrated circuits. Many specific details of several embodiments of the invention are set forth in the following description and in FIGS. 1 through 9 to provide a thorough understanding of such embodiments. One skilled in the art, however, will understand that various embodiments may be practiced without several of the details described in the following description.

FIG. 1 is a diagrammatic block view of a selective edge phase mixing apparatus 10, according to various embodiments. The apparatus 10 may include a first buffer 12 that receives a clock signal CLK IN and generates an output signal CLK BUF. The first buffer 12 may include any circuit that suitably provides isolation to subsequent stages, and/or presents desired impedance characteristics to the input stage and to following stages. In the various embodiments, the buffer 12 may include a pair of serially-coupled NOT gates. The apparatus 10 may also include a selective edge phase mixing unit 14 that is configured to receive the output signal CLK BUF from the first buffer 12 and to selectively provide duty cycle adjustment to the output signal CLK BUF, so that a signal CLK ADJ is generated as a clock signal having a desired duty cycle to subsequent stages. As will be discussed in greater detail below, the duty cycle adjustment provided by the selective edge phase mixing unit 14 may be applied to a rising edge of a clock cycle, or alternatively, to a falling edge of the clock cycle. In either case, the selective edge phase mixing unit 14 is configured to receive a subtract duty (SD) signal, and, an add duty (AD) signal, that suitably assist the selective edge phase mixing unit 14 in generating a desired duty cycle adjustment by providing information to the unit 14 that indicates whether the duty cycle requires augmentation (e.g., the AD signal is applied to increase the duty cycle of the received clock signal), or whether the duty cycle should be decreased (e.g., the SD signal is applied to decrease the duty cycle).

The AD signal and the SD signal are generated in other monitoring circuits, which are not shown in FIG. 1. Briefly, and in general terms, monitoring and control circuits may be configured to dynamically compare a generated clock signal (e.g., the CLK IN signal) and a CLK OUT signal developed by the unit 16 and generates the AD and SD signals in response to the comparison. For example, a phase detection circuit may be employed, which receives the CLK IN signal and the CLK OUT signal, which dynamically determines a relative phase difference between the signals, and generates appropriate signals (e.g., the AD, SD, or other control signals) that may be transferred to the unit 14. Alternatively, the monitoring circuits may perform a static comparison of the CLK IN signal and the CLK OUT signal to generate the AD and the SD signals. Accordingly, the monitoring and control circuits perform the static comparison using hardware elements that are selected during device fabrication, which generate an approximately constant duty cycle correction. The various embodiments of the selective edge phase mixing unit 14 will be discussed in greater detail below. The apparatus 10 may also include a second buffer 16 that receives the CLK ADJ signal, and provides a CLK OUT signal to subsequent stages. Although the second buffer 16 may include any circuit that suitably provides isolation, and/or presents desired impedance characteristics to the unit 14 and to following stages. In the various embodiments, the buffer 16 may include a NAND gate.

Figure 2:
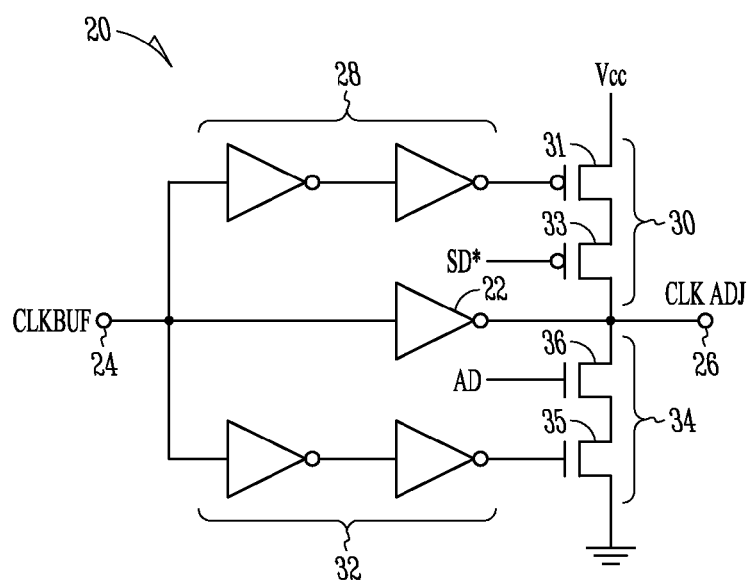
FIG. 2 is a schematic view of a selective edge phase mixing unit according to various embodiments.

FIG. 2 is a schematic view of a selective edge phase mixing unit 20 according to the various embodiments. The mixing unit 20 may include a NOT gate 22 that couples an input 24 of the mixing unit 20 to an output 26. Accordingly, the output signal CLK BUF may be coupled to the input 24, so that the output signal CLK BUF may be coupled to the output 26 through the NOT gate 22. A first logic gate 28, which in the various embodiments may include a pair of serially-coupled NOT gates, which may be coupled to a pull-up circuit 30 that is also coupled to the output 26. The pull up circuit 30 may include a pull-up device 31 that is coupled to the first logic gate 30, and a pull-up enable device 33 that is coupled to the pull-up device 31, which is responsive to an SD* signal (where the * indicates an active low state). Accordingly, the pull-up circuit 30 may include a pair of suitably-coupled p-type Field Effect Transistor (pFET) devices that are coupled to a power supply voltage Vcc so that the power supply voltage Vcc may be coupled to the output 26 when the pFET devices in the pull-up circuit 30 are active.

The selective edge phase mixing unit 20 may also include a second logic gate 32 coupled to a pull-down circuit 34 that is coupled to the output 26. The second logic gate 32, in the various embodiments, may also include a pair of serially-coupled NOT gates, which may be coupled to a pull-down circuit 34 that is also coupled to the output 26. The pull-down circuit 34 may include a pull-down device 35 that is coupled to the second logic gate 32, and a pull-down enable device 36 that is coupled to the pull-down device 35, which is responsive to an AD signal. The pull-down circuit 34 may include, in the various embodiments, a pair of suitably-coupled n-type Field Effect Transistor (nFET) devices that are coupled to a selected potential, so that the output 26 may be coupled to ground when the nFET devices in the pull-down circuit 34 are active, for example. Although the pull-up circuit 30 and the pull-down circuit 34 depicted in FIG. 2 are shown as including coupled pFET and nFET devices, respectively, it is understood that the functionality of the pull-up circuit 30 and the pull-down circuit 34 may be readily provided by other devices. For example, one or more multiplexer circuits (MUX) that are responsive to the enabling signals (e.g., AD and SD*) may also be used.

Figure 3:
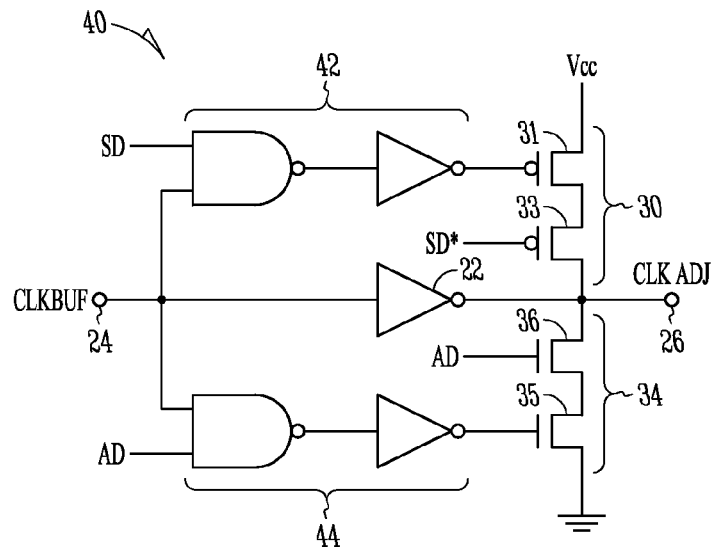
FIG. 3 is a schematic view of a selective edge phase mixing unit according to various embodiments.

FIG. 3 is a schematic view of a selective edge phase mixing unit 40 according to the various embodiments. Since various details have been discussed in connection with other embodiments, such details will not necessarily be discussed further. The mixing unit 40 may include a first logic gate 42, which in the various embodiments, may include a NAND gate that is serially-coupled to a NOT gate. The first logic gate 42 may be coupled to the pull-up circuit 30, which is also coupled to the output 26. The pull-up circuit 30 may include a pull-up device 31 that is coupled to the first logic gate 30, and a pull-up enable device 33 that is coupled to the pull-up device 31, as previously described. The NAND gate in the first logic gate 42 is suitably configured to receive an SD enable signal, while the pull-up enable device 33 is responsive to the SD* signal.

The selective edge phase mixing unit 40 may also include a second logic gate 44, which in the various embodiments, may include a NAND gate that is serially serially-coupled to a NOT gate. The first logic gate 44 may be coupled to the pull-down circuit 34, which is also coupled to the output 26. The second logic gate 44 may be coupled to the pull-down circuit 34, which may also be coupled to the output 26. The NAND gate in the second logic gate 44 is suitably configured to receive the AD enable signal. The pull-down enable device 36 also similarly responsive to the AD enable signal. The selective edge phase mixing unit 40 is capable of providing power saving benefits (as well as lower operational temperatures), since the pull-up circuit 30 and the pull-down circuit 34 are simultaneously in an active state, or they are simultaneously in a non-active state. Accordingly, in cases where minimal or no duty cycle adjustment is required, the selective edge mixing unit 40 may remain in the non-active state.

Figure 4:
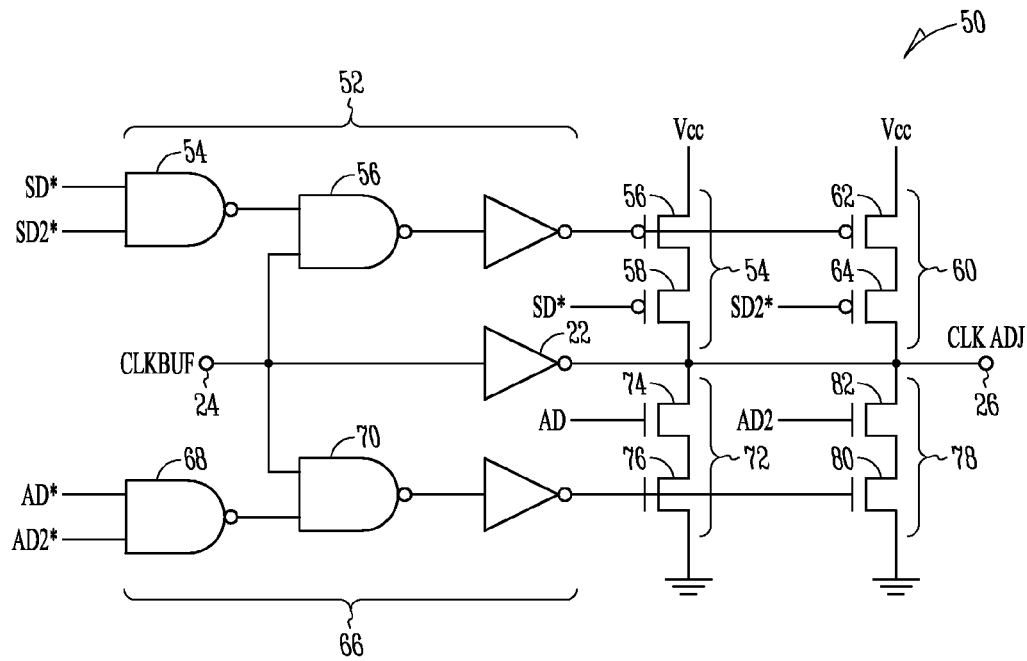
FIG. 4 is a schematic view of a selective edge phase mixing unit according to various embodiments.

FIG. 4 is a schematic view of a selective edge phase mixing unit 50 according to the various embodiments. Again, since various details have been discussed in connection with other embodiments, such details will not necessarily be discussed further. The mixing unit 50 may include a first logic gate 52, which in the various embodiments, may include a first NAND gate 54 that is configured to receive the SD* enabling signal, and a SD2* enabling signal. In the discussion that follows, the SD2* enabling signal (and also a corresponding SD2 enabling signal) may be directed to initiating a second-order correction to the duty cycle of the CLK BUF signal, as will be discussed subsequently.

The first logic gate 52 may also include a second NAND gate 56 that is coupled to the first NAND gate 54 and also to the input 24. The first logic gate 52 may be coupled to a first pull-up circuit 54 through an inverter stage. The first pull-up circuit 54 may also be coupled to the output 26. The first pull-up circuit 54 may include a pull-up device 56 that is coupled to the first logic gate 52, and a pull-up enable device 58 that is coupled to the pull-up device 56. The pull-up enable device 56 is responsive to the SD* signal. A second pull-up circuit 60 may include a pull-up device 62 that is also coupled to the pull-up device 56, and to the first logic gate 52. The second pull-up circuit 60 also includes a pull-up enable device 64 that is coupled to the output 26 and the pull-up device 62, which is responsive to the SD2* enable signal.

The selective edge phase mixing unit 50 may also include a second logic gate 66, which in the various embodiments may include a first NAND gate 68 that is configured to receive the AD* enabling signal and an AD2* enabling signal. In the discussion that follows, the AD2* enabling signal (and also a corresponding AD2 enabling signal) may be directed to initiating second-order corrections to the duty cycle of the clock signal (CLK BUF), as will be discussed in further detail below.

The second logic gate 66 may include a second NAND gate 70 that is coupled to the first NAND gate 68 and also to the input 24. The second logic gate 66 may be coupled to a first pull-down circuit 72 through an inverter stage. The first pull-down circuit 72 may also be coupled to the output 26.

The first pull-down circuit 72 may include a pull-down device 76 that is coupled to the second logic gate 66, and a pull-down enable device 74 that is coupled to the pull-down device 76, which is also coupled to ground. The pull-down enable device 74 is responsive to the AD signal.

A second pull-down circuit 78 may include a pull-down device 80 that is also coupled to the pull-down device 76, and to the second logic gate 66. The second pull-down circuit 78 also includes a pull-down enable device 82 that is coupled to the output 26 and the pull-down device 80. The pull down enable device 82 is responsive to the AD2 enable signal. The presence of the first pull-up circuit 54, the second pull-up circuit 60, the first pull-down circuit 72 and the second pull down circuit 78 in the selective edge phase mixing unit 50 may generally provide more precise adjustments to the duty cycle correction than would be obtainable if only the first pull-up circuit 54 and the first pull-down circuit 72 were provided.

Figure 5:
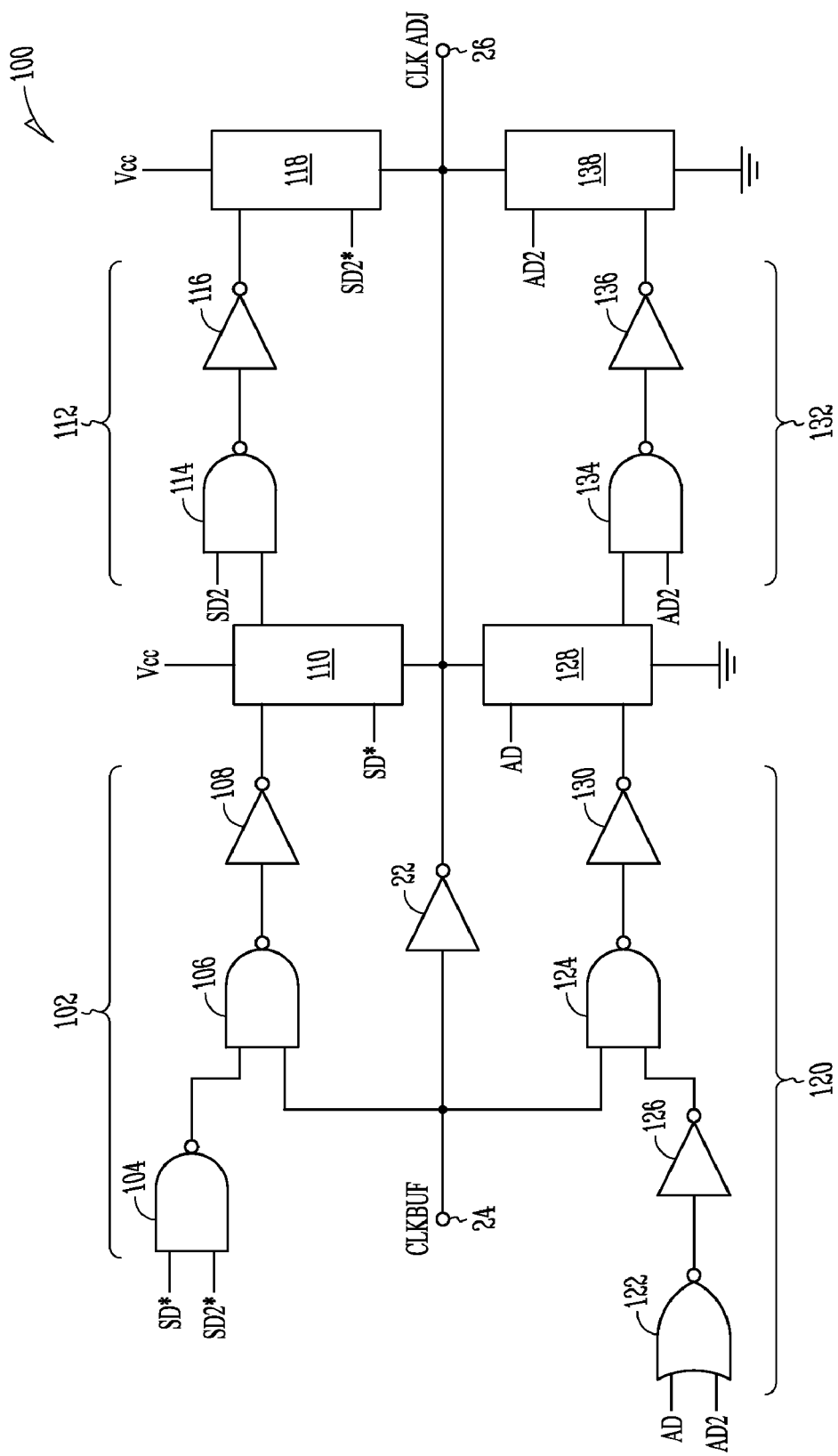
FIG. 5 is a schematic view of a selective edge phase mixing unit according to various embodiments.

FIG. 5 is a schematic view of a selective edge phase mixing unit 100 according to the various embodiments. Yet again, many details shown in FIG. 5 have been discussed in connection with other embodiments. Accordingly, such details will not necessarily be discussed further. The mixing unit 100 may include a first logic gate 102, which in the various embodiments, may include a first NAND gate 104 that is configured to receive the SD* enabling signal and the SD2* enabling signal. The SD* and the SD2* signals may be generated by the control and monitoring circuits, as previously described. The first logic gate 102 may also include a second NAND gate 106 that is coupled to the first NAND gate 104 through a NOT gate 108 and also to the input 24. The first logic gate 102 may be coupled to a first pull-up interpolation circuit 110. The first pull-up interpolation circuit 110 may include pull-up and pull-up enable devices, as previously described, which may also be arranged in the form of first and second pull-up circuits. The first pull-up interpolation circuit 110 may therefore be configured to receive the SD* enable signal, and to receive supply voltage Vcc from a power supply, and may also be coupled to the output 26.

The mixing unit 100 may also include an interstage logic gate 112 that may include a NAND gate 114 that is coupled to the first pull-up interpolation circuit 110 and is also configured to receive the SD2 enable signal. The NAND gate 114 is serially coupled to a NOT gate 116, that is further coupled to a second pull-up interpolation circuit 118. The second pull-up interpolation circuit 118 may also be configured to receive an SD2* enable signal, and may also be coupled to Vcc and to the output 26. Although FIG. 5 shows a first pull-up interpolation circuit 110 and a second pull-up interpolation circuit 118, with an interstage logic gate 112 coupled there between, it is additional pull-up interpolation circuits and interstage logic gates may be added, which may be responsive to higher-order enable signals (e.g., SD3, SD3*, etc.) to provide a refined and/or more selective duty cycle compensation to the CLK BUF signal.

Still referring to FIG. 5, the selective edge phase mixing unit 100 may also include a second logic gate 120, which in various embodiments, may include a NOR gate 122 that is configured to receive the AD enabling signal, and the AD2 enabling signal. The second logic gate 120 may also include a NAND gate 124 that is coupled to the NOR gate 122 through a NOT gate 126 and also to the input 24. The second logic gate 120 may be coupled to a first pull-down interpolation circuit 128 through a NOT gate 130. The first pull-down interpolation circuit 128 may include pull-down and pull-down enable devices, as previously described, which may also be arranged in first and second pull-down circuits, as previously described. The first pull-down interpolation circuit 128 may therefore be configured to receive the AD enable signal, and may also be coupled to the output 26 and to ground.

The mixing unit 100 may also include an interstage logic gate 132 that includes a NAND gate 134 coupled to the first pull-down interpolation circuit 128 and is also configured to receive the AD2 enable signal. The NAND gate 134 is serially coupled to a NOT gate 136, that is further coupled to a second pull-down interpolation circuit 138. The second pull-down interpolation circuit 138 may be configured to receive an AD2 enable signal, and may also be coupled to a ground potential and to the output 26. Again, although FIG. 5 shows a first pull-down interpolation circuit 128 and a second pull-down interpolation circuit 138, with an interstage logic gate 132 coupled between the first pull-down interpolation circuit 128 and a second pull-down interpolation circuit 138, it is understood that additional pull-down interpolation circuits and interstage logic gates may be added.

Figure 6A:
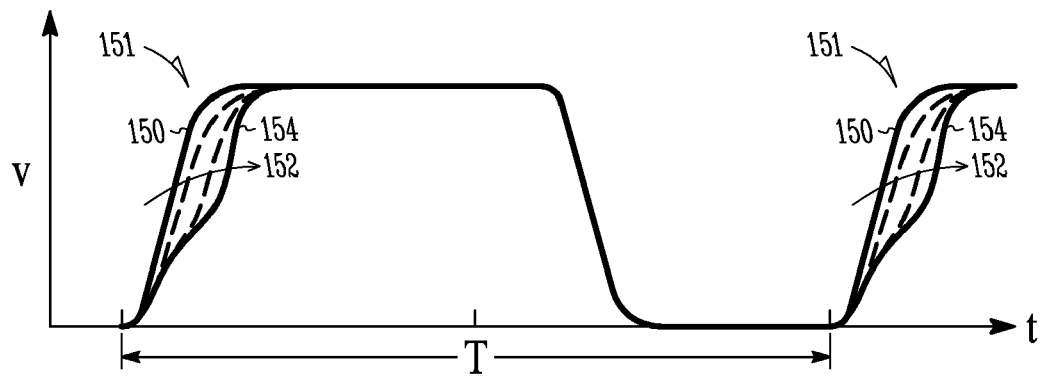
FIGS. 6A-6B are relative timing diagrams describing the operation of the embodiment shown in FIG. 2.
Figure 6B:
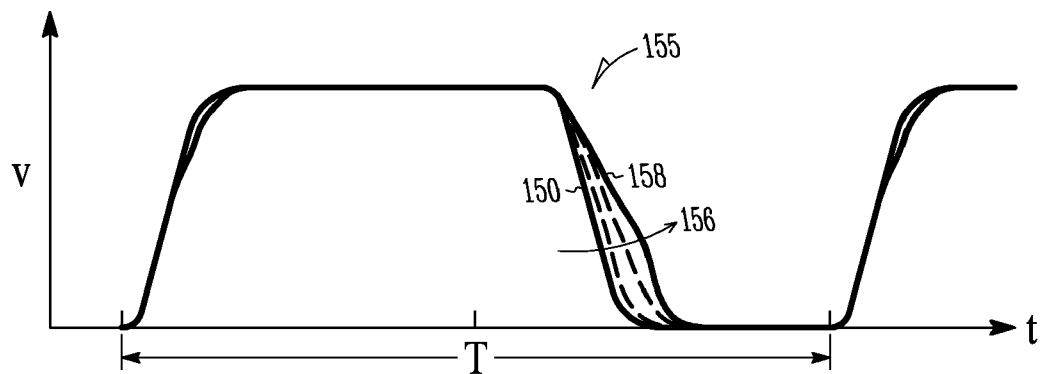

FIG. 6 is a relative timing diagram that will be used to describe the operation of various features of the embodiment shown in FIG. 2. Referring now to FIGS. 2 and 6, it can be seen that a non-compensated clock signal 150 having a period T (e.g., the output signal CLK BUF shown in FIG. 2) is received by the selective edge phase mixing unit 20. In order to decrease a duty cycle of the clock signal 150, a rising edge 151 of the non-compensated clock signal 150 is shifted in a direction 152 in response to application of the appropriate enabling signal to the pull-down circuit 34. Accordingly, the compensated clock signal 154 is obtained, which effectively decreases the duty cycle of the non-compensated clock signal 150. It is understood that the rising edge 151 of the non-compensated clock signal 150 may be shifted to any position between the non-compensated clock signal 150 and the compensated clock signal 154 upon the application of a suitable enabling signal. It is further understood that the non-compensated clock signal 150 may be shifted beyond the compensated clock signal 154 shown in FIG. 6.

The duty cycle may also be increased by the selective edge phase mixing unit 20. The non-compensated clock signal 150 (e.g., the CLK BUF signal shown in FIG. 2) may be received by the selective edge phase mixing unit 20, whereupon a falling edge 155 of the non-compensated clock signal 150 is shifted in a direction 156 in response to application of the appropriate enabling signal to the pull-up circuit 30. Accordingly, the compensated clock signal 158 is obtained, which increases the duty cycle of the non-compensated clock signal 150. Again, it is understood that the falling edge of the non-compensated clock signal 150 may be shifted to any position between the non-compensated clock signal 150 and the compensated clock signal 158 upon the application of a suitable enabling signal to the pull-up circuit 30. It is further again understood that the non-compensated clock signal 150 may be shifted beyond the compensated clock signal 158 shown in FIG. 6.

Figure 7A:
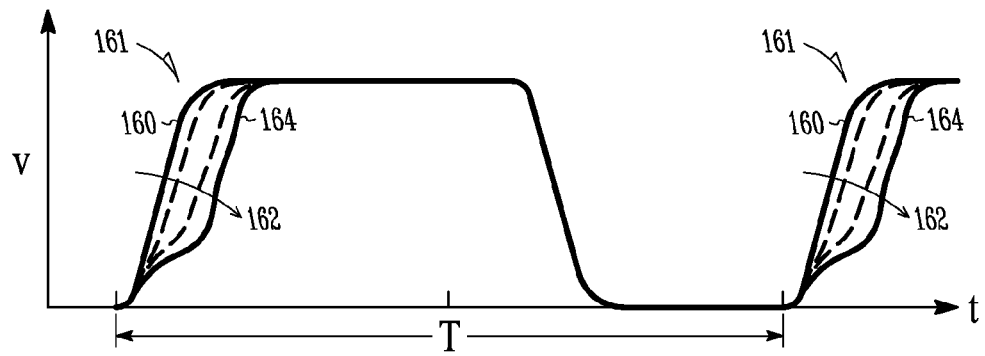
FIGS. 7A-7B are relative timing diagrams describing the operation of the embodiment shown in FIG. 4.
Figure 7B:
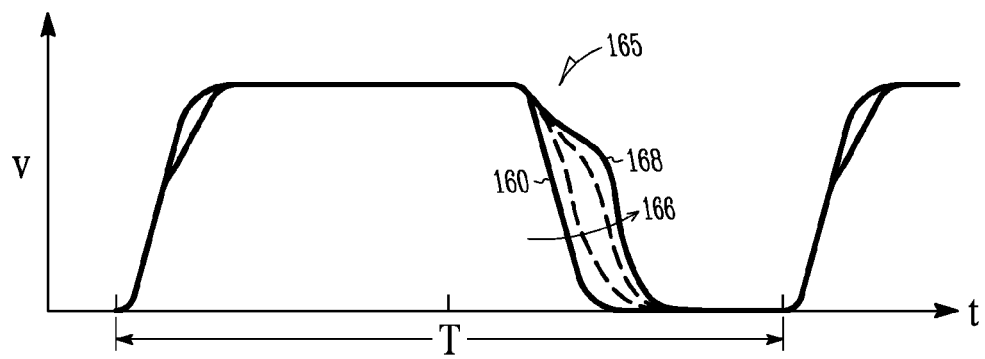

FIG. 7 is a relative timing diagram that will be used to describe the operation of the embodiment shown in FIG. 5. Referring now to FIGS. 5 and 7, it can be seen that a non-compensated clock signal 160 having a period T may be received by the selective edge phase mixing unit 100. In order to decrease a duty cycle of the clock signal 160, a rising edge 161 of the non-compensated clock signal 160 may be shifted in a direction 162 in response to application of the appropriate enabling signal to the pull-down interpolation circuits 128 and 138. As previously discussed, first order, second order, and even higher order corrections can be made to the non-compensated clock signal 160. Accordingly, the compensated clock signal 164 is obtained, which effectively decreases the duty cycle of the non-compensated clock signal 160. It is also again understood that the rising edge of the non-compensated clock signal 160 may be shifted to any position between the non-compensated clock signal 160 and the compensated clock signal 164 upon the application of suitable first order, second order, and even higher order enabling signals. It is further understood that the non-compensated clock signal 160 may be shifted further beyond the compensated clock signal 164 shown in FIG. 7.

The duty cycle may also be increased by the selective edge phase mixing unit 100. The non-compensated clock signal 160 (e.g., the CLK BUF signal shown in FIG. 5) is received by the selective edge phase mixing unit 100, so that a falling edge 165 of the non-compensated clock signal 160 is shifted in a direction 166 in response to application of the appropriate enabling signals to the pull-up interpolation circuits 110 and 118. Accordingly, the compensated clock signal 168 is obtained, which increases the duty cycle of the non-compensated clock signal 160. Again, it is understood that the falling edge of the non-compensated clock signal 160 may be shifted to any position between the non-compensated clock signal 160 and the compensated clock signal 168 upon the application of a suitable enabling signals to the pull-up interpolation circuits. It is further again understood that the non-compensated clock signal 160 may be shifted still further, and beyond the compensated clock signal 168 shown in FIG. 7.

Figure 8:
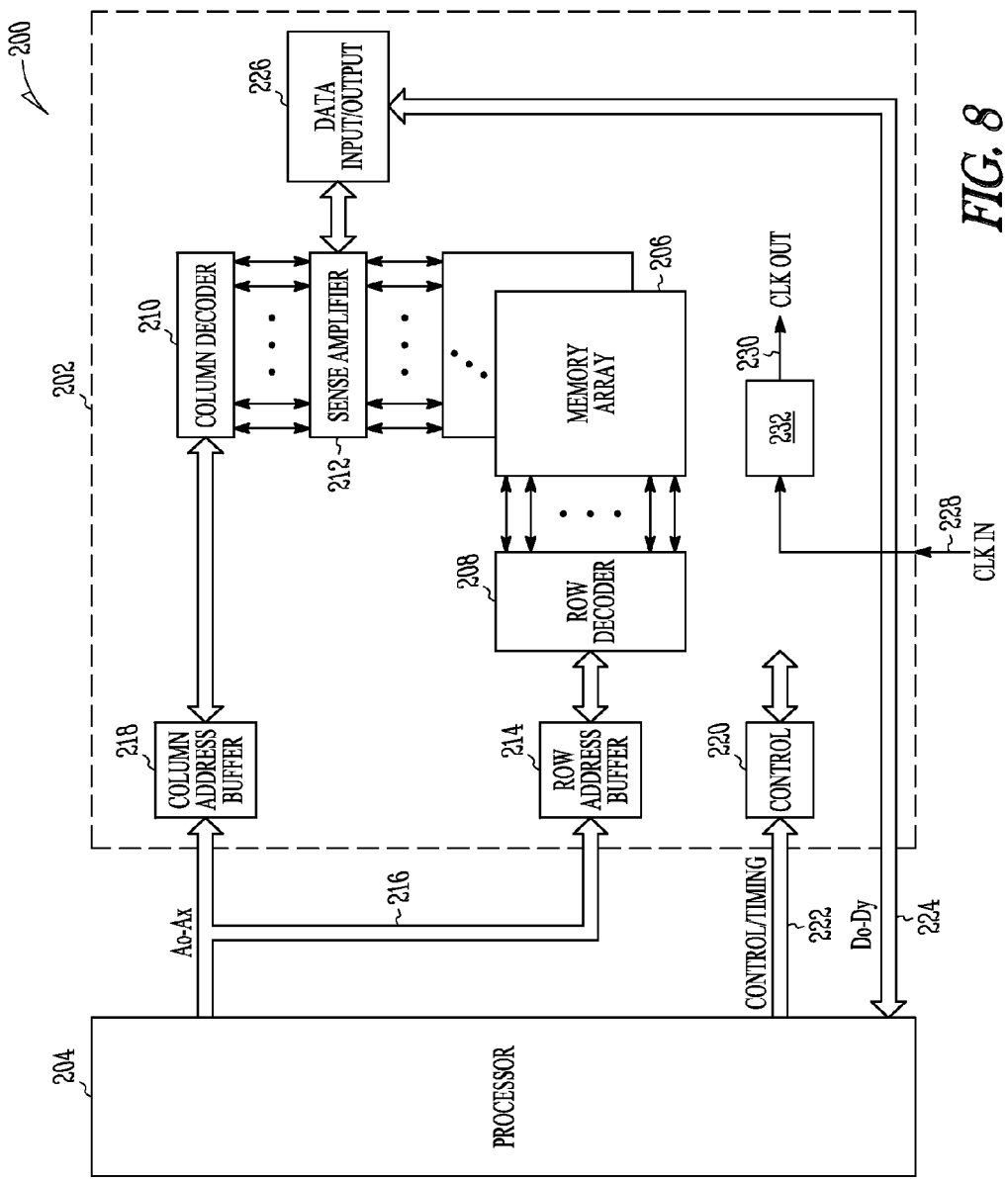
FIG. 8 is a diagrammatic block view of an electronic system according to various embodiments.

FIG. 8 is a diagrammatic block view of an electronic system 200 according to the various embodiments. The electronic system 200 may include one or more integrated circuit dynamic memory devices 202, coupled to a processor 204. The memory device 202 typically includes a plurality of dynamic memory cells that are generally arranged in rows and columns in one or more memory arrays 206. The integrated circuit dynamic memory device 202 may also include a row decoder 208 and a column decoder 210. The row decoder 208 operates in combination with a row address buffer 214 to receive address signals on an address bus 216 coupled to the processor 204. Accordingly, the address signals received by the row decoder 208 and the row address buffer 214 are operable to direct the memory device 202 to one or more rows in the array 206. Similarly, a column address buffer 218 may be provided that operates in combination with the column decoder 210 to receive the address signals on the address bus 216, so that the memory device 202 may be directed to one or more columns in the array 206.

The electronic system 200 may also include a control unit 220, which is operable to receive control signals on a control/timing bus 222, and to interpret various memory access requests. Once the memory device 202 is properly accessed by receiving suitable control and address signals from the processor 204, data may be communicated to or from the memory device 202 on a data bus 224, which is coupled to a data input/output unit 226. The data input/output unit 226 is operable to read or write the data to the array 206 in combination with a sense amplifier 212.

The memory device 202 may comprise a synchronous memory device, which is synchronized by an external clock signal 228, such as the previously-described CLK IN signal, so that the various memory operations may be synchronously performed at selected times. Examples of such synchronous integrated memory devices may include synchronous dynamic random access memory (SDRAM) devices, synchronous static random access memory (SSRAM) devices, and may further include memory devices such as a synchronous link dynamic access memory (SLDRAM) devices, a RAMBUS dynamic random access memory (RDRAM), as well as other memory devices. Accordingly, an internal clock signal 230 (e.g., CLK OUT) may be generated from the external clock signal 228. The internal clock signal 230 may receive the duty cycle correction using the selective edge phase mixing unit 232, according to the various embodiments discussed in detail above. Although not shown in FIG. 8, it is nevertheless understood that additional circuitry may be present in FIG. 8, which may be omitted in the interests of brevity of description, and in order to focus on the inventive aspects. It is further understood that the selective edge phase mixing unit 232 may be formed as an integral portion of the memory device 202, or it may be formed separately from the memory device 202.

Figure 9:
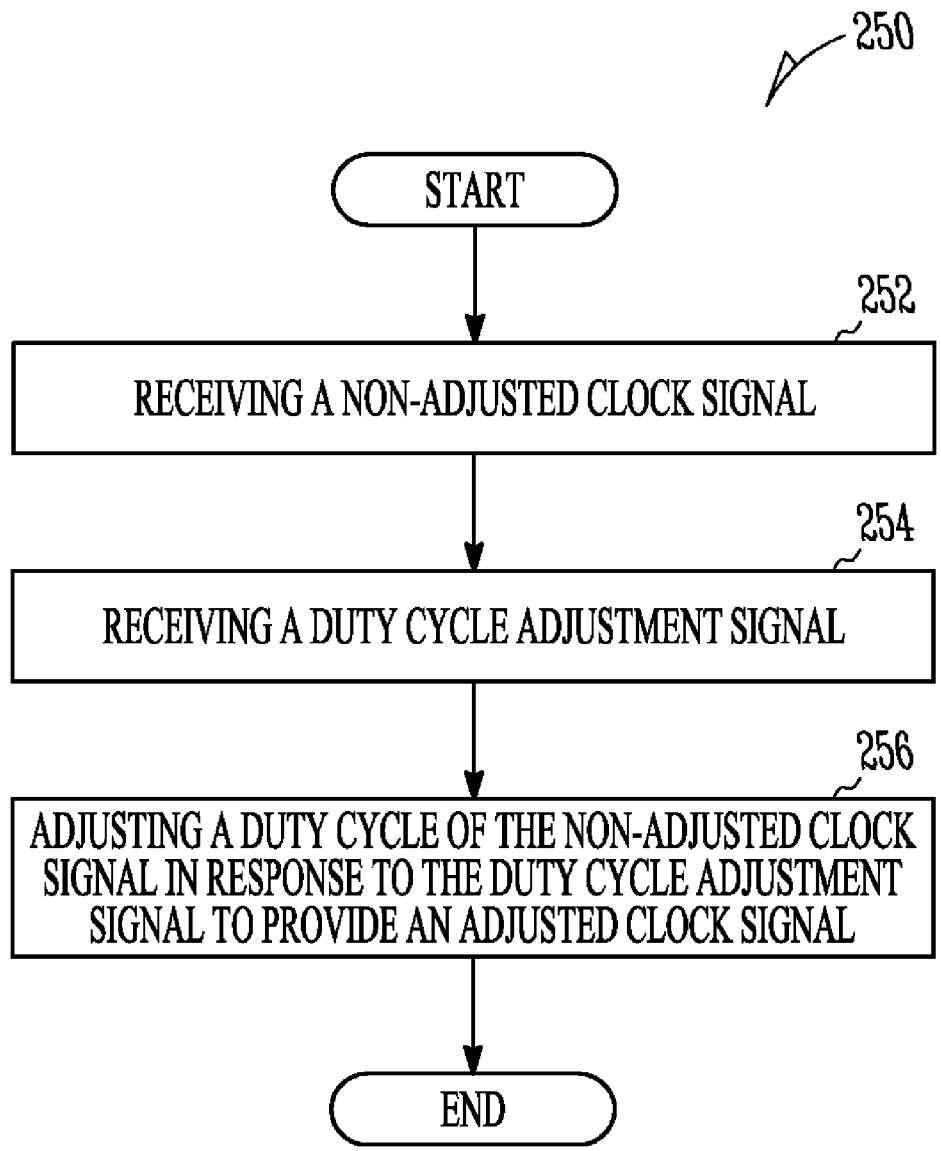
FIG. 9 is a flowchart for a method of adjusting a duty cycle in a received clock signal according to the various embodiments.

FIG. 9 is a flowchart that will be used to describe a method 250 of adjusting a duty cycle in a received clock signal. At block 252, a non-adjusted clock signal is received. At block 254, a duty cycle adjustment signal is received, that may be suitably formatted to increase the duty cycle of the received clock signal, or to decrease the duty cycle of the received clock signal. As described in greater detail above, the duty cycle adjustment signal may include first order adjustment signals (e.g., SD and AD signals, as shown in FIGS. 1 and 2), or first order adjustment signals in combination with second order (e.g., SD2 and AD2 signals), or even higher order adjustment signals. At block 256, the duty cycle of the non-adjusted clock signal is adjusted in response to the received duty cycle to provide an adjusted clock signal.

While the various embodiments of the invention have been illustrated and described, as noted above, many changes can be made without departing from the scope of this disclosure. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A selective edge phase mixing apparatus, comprising:
   a first logic gate to receive a clock signal and a first control signal;
   at least one pull-up circuit having a pull-up device and a pull-up enable device coupled to an output of the first logic gate;
   a second logic gate to receive the clock signal, and to receive a second control signal; and
   at least one pull-down circuit having a pull-down device and a pull-down enable device coupled to an output of the second logic gate, wherein the pull-up and the pull-down circuits communicate with an output that provides a duty cycle corrected version of the clock signal.

2. The apparatus of claim 1, wherein the pull-up device and the pull-up enable device include serially-coupled pFET devices, and the pull-up device is coupled to a supply potential.

3. The apparatus of claim 1, wherein the pull-down device and the pull-down enable device include serially-coupled nFET devices, and the pull-down device is coupled to a ground potential.

4. The apparatus of claim 1, wherein the first logic gate includes at least a pair of serially-coupled NOT gates.

5. The apparatus of claim 1, wherein the second logic gate includes at least a pair of serially-coupled NOT gates.

6. The apparatus of claim 1, wherein the first logic gate includes at least a NOT gate operably coupled to a NAND gate.

7. The apparatus of claim 1, wherein the second logic gate includes at least a NOT gate operably coupled to a NAND gate.

8. A selective edge phase mixing apparatus, comprising:
   a first logic gate responsive to a subtract duty (SD) control signal;
   a pull-up interpolation circuit coupled to the first logic gate and responsive to the SD control signal;
   a second logic gate responsive to an add duty (AD) control signal; and
   a pull-down interpolation circuit coupled to the second logic gate and responsive to the AD control signal, wherein the pull-up and the pull-down interpolation circuits communicate with an output of the apparatus that provides a duty cycle corrected clock signal when the first and second logic gates are operably coupled to the SD and the AD control signals, respectively.

9. The apparatus of claim 8, wherein the first logic gate or the second logic gate includes at least one NAND gate operably coupled to a NOT gate.

10. The apparatus of claim 8, wherein the pull-up interpolation circuit includes a pull-up device and a pull-up enable device.

11. The apparatus of claim 10, wherein the pull-up device comprises a pFET device.

12. The apparatus of claim 10, wherein the pull-up enable device is coupled to the SD control signal.

13. The apparatus of claim 8, wherein the pull-down interpolation circuit includes a pull-down device and a pull-down enable device.

14. The apparatus of claim 13, wherein the pull-down device comprises an nFET device.

15. The apparatus of claim 13, wherein the pull-down enable device is coupled to the AD control signal.

16. A method, comprising:
   receiving a non-adjusted clock signal at an input;
   receiving at least one duty cycle adjustment signal generated by an edge phase mixing apparatus that includes a first logic gate and a second logic gate coupled to the input, wherein the first logic gate is responsive to a subtract duty (SD) control signal, and wherein the second logic gate is responsive to an add duty (AD) control signal; and
   adjusting a duty cycle of the non-adjusted clock signal in response to the received duty cycle adjustment signal, to provide an adjusted clock signal.

17. The method of claim 16, wherein receiving at least one duty cycle adjustment signal comprises receiving first order signals and higher order signals to selectively increase or decrease the duty cycle of the non-adjusted clock signal.

18. The method of claim 16, wherein adjusting the duty cycle of the non-adjusted clock signal comprises enabling a pull-up interpolation circuit to affect a falling edge of the non-adjusted clock signal to increase the duty cycle.

19. The method of claim 16, wherein adjusting the duty cycle of the non-adjusted clock signal comprises enabling a pull-down interpolation circuit to affect a rising edge of the non-adjusted clock signal to increase the duty cycle.

20. The method of claim 16, comprising providing a buffered version of the adjusted clock signal to an external device.

* * * * *